(12) United States Patent
Sinha et al.

(10) Patent No.: US 12,269,106 B2
(45) Date of Patent: Apr. 8, 2025

(54) TWO-STEP SOLDER-MASK-DEFINED DESIGN

(71) Applicant: Lodestar Licensing Group LLC, Evanston, IL (US)

(72) Inventors: Koustav Sinha, Boise, ID (US); Hyunsuk Chun, Boise, ID (US)

( * ) Notice: Subject to any disclaimer, the term of this patent is extended or adjusted under 35 U.S.C. 154(b) by 0 days.

(21) Appl. No.: 17/558,546

(22) Filed: Dec. 21, 2021

(65) Prior Publication Data

US 2022/0111457 A1   Apr. 14, 2022

Related U.S. Application Data

(63) Continuation of application No. 16/664,627, filed on Oct. 25, 2019, now Pat. No. 11,207,744.

(51) Int. Cl.
*B23K 1/20* (2006.01)
*H01L 23/49* (2006.01)
*H01L 23/498* (2006.01)
*B23K 101/40* (2006.01)
*B23K 101/42* (2006.01)

(52) U.S. Cl.
CPC .......... *B23K 1/20* (2013.01); *H01L 23/49816* (2013.01); *B23K 2101/40* (2018.08); *B23K 2101/42* (2018.08)

(58) Field of Classification Search
CPC .. B23K 1/20; B23K 2101/40; B23K 2101/42; H01L 23/49816
USPC ........................................................ 438/613
See application file for complete search history.

(56) References Cited

U.S. PATENT DOCUMENTS

| 6,165,885 | A   | * | 12/2000 | Gaynes  | H01L 23/49811 |
|           |     |   |         |         | 438/615       |
| 6,417,089 | B1  |   | 7/2002  | Kim et al. |            |
| 6,483,191 | B2  | * | 11/2002 | Umezaki | H01L 23/49816 |
|           |     |   |         |         | 257/737       |
| 6,579,738 | B2  | * | 6/2003  | Farrar  | H01L 21/764   |
|           |     |   |         |         | 438/33        |
| 6,759,738 | B1  | * | 7/2004  | Fallon  | H01L 23/49827 |
|           |     |   |         |         | 257/737       |

(Continued)

FOREIGN PATENT DOCUMENTS

| CN | 102187749 A   | 9/2011 |
| JP | 2004-207745 A | 7/2004 |

(Continued)

OTHER PUBLICATIONS

TW Patent Application No. 109136832—Taiwanese Office Action and Search Report, dated Jun. 23, 2021, with English Translation, 12 pages.

(Continued)

*Primary Examiner* — Monica D Harrison

(57) ABSTRACT

An apparatus for a BGA package includes a pad mounted on a substrate. The apparatus also includes a solder resist layer disposed over the substrate and a buffer layer disposed over the solder resist layer. The solder resist layer can have a first aperture and the buffer layer can have a second aperture. The first and second apertures are aligned such that at least a portion of the pad is exposed to create a solder-mask-defined mounting pad. A diameter of the second aperture is larger than a diameter of the first aperture.

12 Claims, 3 Drawing Sheets

(56) References Cited

U.S. PATENT DOCUMENTS

| | | | |
|---|---|---|---|
| 7,512,800 B2* | 3/2009 | Hopkins | G06Q 20/40975 |
| | | | 705/72 |
| 7,521,800 B2* | 4/2009 | Chu | H05K 3/243 |
| | | | 257/E23.021 |
| 7,575,994 B2* | 8/2009 | Morita | H01L 24/12 |
| | | | 257/737 |
| 2004/0132230 A1 | 7/2004 | Kim | |
| 2011/0133332 A1* | 6/2011 | Mun | H01L 23/49811 |
| | | | 257/737 |
| 2011/0189848 A1 | 8/2011 | Ewert et al. | |
| 2011/0201194 A1 | 8/2011 | Gruber et al. | |
| 2017/0125329 A1 | 5/2017 | Lewandowski et al. | |
| 2021/0121969 A1 | 4/2021 | Sinha et al. | |

FOREIGN PATENT DOCUMENTS

| | | |
|---|---|---|
| KR | 20010068233 A | 7/2001 |
| TW | 201318113 A | 5/2013 |

OTHER PUBLICATIONS

Chinese patent office, "China Office Action," issued in connection with China Patent Application No. 202011143841.X dated Sep. 15, 2024 (15 pages) (8 pages of English Translation and 7 pages of Original Document).

Chinese patent office, "China Office Action," issued in connection with China Patent Application No. 202011143841.X dated Jan. 23, 2025 (7 pages) (2 pages of English Translation and 5 pages of Original Document).

\* cited by examiner

TWO-STEP SOLDER-MASK-DEFINED DESIGN

CROSS-REFERENCE TO RELATED APPLICATION(S)

This application is a continuation of U.S. application Ser. No. 16/664,627, filed Oct. 25, 2019; which is incorporated herein by reference in its entirety.

TECHNICAL FIELD

The present invention relates generally to the mounting and connecting of electronic devices and, more particularly, to apparatus and methods providing a solder ball pad structure on an interposer or a semiconductor die using a two-step solder-mask-defined design.

BACKGROUND

An increasing demand for electronic equipment that is smaller, lighter, and more compact has resulted in a concomitant demand for semiconductor packages that have smaller outlines and mounting areas or "footprints." One response to this demand has been the development of the so-called "flip-chip" method of attachment and connection of semiconductor chips to substrates. Sometimes referred to as the "Controlled Collapse Chip Connection," or "C4," method, the technique involves forming balls of a conductive metal, e.g., solder or gold, on input/output connection pads on the active surface of the chip, then inverting, or "flipping" the chip upside down, and "reflowing" the conductive balls, i.e., heating them to the melting point, to fuse them to corresponding connection pads on a substrate.

Another response has been the development of a so-called ball grid array ("BGA") semiconductor package that "surface mounts" and electrically connects to an associated carrier substrate, e.g., a printed circuit board ("PCB") structure, with a plurality of solder balls in a method sometimes referred to as the "C5" method that is analogous to the flip-chip method described above for mounting and connecting dies.

In both the C4 die and C5 package mounting and connection methods, a plurality of solder balls is attached to respective solder ball mounting lands, or pads, defined on a surface of an interposer substrate or semiconductor die. The solder ball mounting pad may be defined by an opening in an insulative layer or mask called a "passivation layer" in the case of a semiconductor die, or a "solder mask" in the case of an interposer substrate of a BGA package. The passivation layer and solder mask are collectively referred to herein as "solder resist layer." The interposer substrate in a BGA package may comprise a rigid or flexible sheet material.

For some applications, the combined BGA package and carrier substrate (also referred to herein as an "electronic device assembly") is expected to withstand extreme temperature cycling. For example, in some automotive and server applications, the electronic device assembly may be required to withstand large temperature ranges and still be fully functional for a long life. The electronic device assembly can be required to withstand large temperature swings (e.g., −40° C. to 125° C.) every 40 minutes for 1000 to 2000 cycles as a measure of its capability to withstand field conditions. Because the carrier substrate (e.g., PCB board) and BGA package can be made of different materials, there can be a difference in the coefficient of thermal expansion (CTE) between the BGA package and the carrier substrate. The difference in the CTEs can cause the BGA package and carrier substrate to expand at different rates, which can cause stresses in the solder joints electrically connecting the BGA package and the carrier substrate. The stresses in the solder joints can lead to premature failure due to, for example, crack formation and propagation in the solder joint.

DETAILED DESCRIPTION

Embodiments of the present technology are directed to an apparatus and method providing an inventive solder-mask-defined ("SMD") BGA package. In some embodiments, the SMD BGA package is formed using a two-step solder-mask-defined design. The two-step SMD design includes application of a solder resist layer and a buffer layer on top of an interposer substrate of the SMD BGA package. The solder resist layer can cover at least a portion of the surrounding interposing substrate surface, and the buffer layer can cover at least a portion of the solder resist layer. The SMD BGA package can also include a metal terminal pad disposed on the interposer substrate, and the metal terminal pad can be at least partially exposed due to apertures in the solder resist layer and the buffer layer. In some embodiments, the application of the solder resist layer and the buffer layer can be a continuous process (e.g., in cases where the solder resist layer and the buffer layer have the same composition). The two-step SMD design can include the creation of the buffer layer aperture and creation of the solder resist layer aperture. The aperture of the buffer layer can be larger than the aperture of the solder resist layer.

Figure 1:
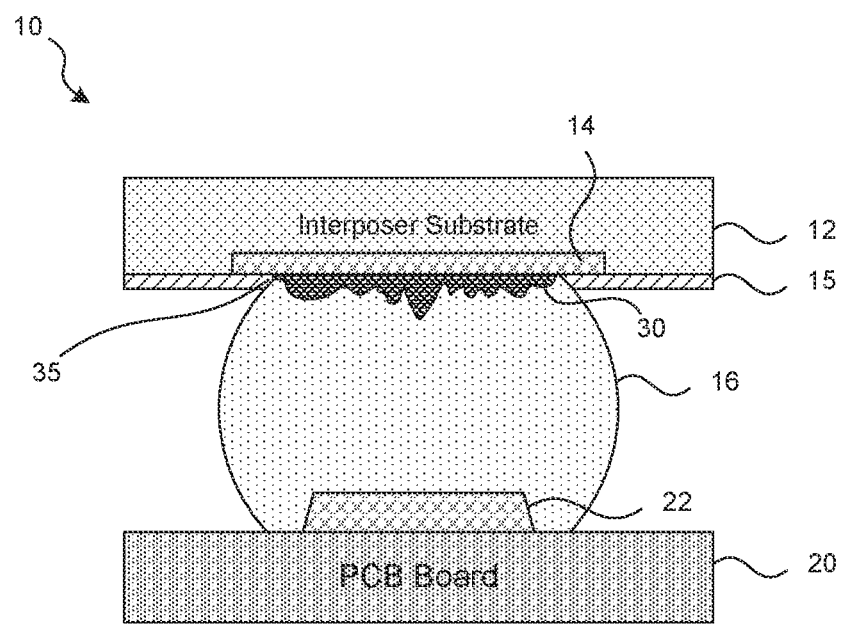
FIG. 1 is a cross-sectional view of a related art electronic device assembly.

FIG. 1 illustrates a cross-sectional view of a conventional electronic device assembly 10. For clarity, only a single solder ball mounting pad and solder ball is shown. However, those skilled in the art understand that the electronic device assembly can include a plurality of solder balls that are respectively attached to a plurality of mounting pads. The electronic device assembly 10 includes an interposer substrate 12 and a metal pad 14 disposed on the interposer substrate 12. A solder resist layer 15 can be formed on top of the interposer substrate 12. The solder resist layer 15 can include an opening or aperture that aligns with the metal pad 14 to expose the metal pad 14. The electronic device assembly 10 can also include a metal trace 22 disposed on a carrier substrate 20 (e.g., a PCB board). A solder joint 16 is formed by depositing a solder ball between the interposer substrate 12 and the carrier substrate 20. The solder joint 16 can form an electrical connection between the metal pad 14 and the metal trace 22. The solder joint 16 connects to the metal pad via the aperture in the solder resist layer 15. The solder ball is typically made of a different material than the metal pad 14. Thus, when the solder joint 16 is formed on metal pad 14, the different materials of the solder ball and the metal pad 14 intermix to form an intermetallic compound ("IMC") layer 30 at the interface between the solder joint 16 and the metal pad 14. For example, the solder ball can be made of a tin-lead alloy and the metal pad can be made of copper. When the solder joint 16 is formed, the composition of the IMC layer 30 can include $Cu_6Sn_5$, $Cu_3Sn$, and/or other alloys.

The formation of the IMC layer 30, however, can create reliability issues for the solder joint 16. For example, interfacial delamination or cracks can initiate at the neck 35 of the solder joint 16 where the IMC layer 30 is formed. While the solder resist layer 15 can help in mitigating crack formation, the proximity of the IMC layer 30 to the exterior of the solder joint 16 can allow cracks to initiate and propagate through the solder joint 16, which shortens the life of the electronic device assembly 10. The cracks can initiate due to, for example, a CTE differential between the interposer substrate 12 and the carrier substrate 20. Once initiated, the crack will propagate along the IMC layer 30 or in the bulk solder near the IMC layer 30 until there is an open circuit between the metal pad 14 and the metal trace 22. Crack propagation and the subsequent failure of the electronic device assembly can be accelerated in applications that experience extreme temperature fluctuations such as, for example, automotive and server applications.

In exemplary embodiments of the present technology, one or more buffer layers can be formed on top of the solder resist layer to further block and/or reduce the areas in the IMC layer where potential cracks can initiate. For example, by adding at least one buffer layer made of an organic material on top of the solder resist layer, the distance between the IMC layer and the exterior of the solder joint can be increased. By increasing this distance, the solder joint can withstand higher stresses and for longer periods of time, which can increase the life of the electronic device assembly. Because organic materials can be used for the buffer layer in some embodiments, there is no chemical reaction and an additional IMC layer is not formed between the buffer layer and the solder joint matrix.

Figure 2A:
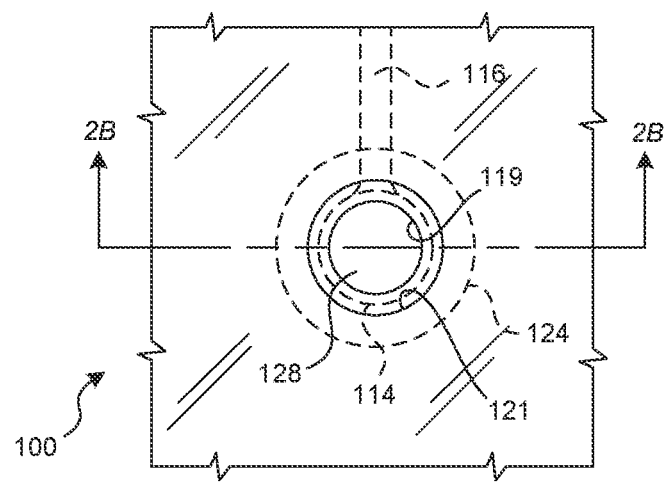
FIG. 2A is a top view of a portion of a BGA package in accordance with an embodiment of the present technology.
Figure 2B:
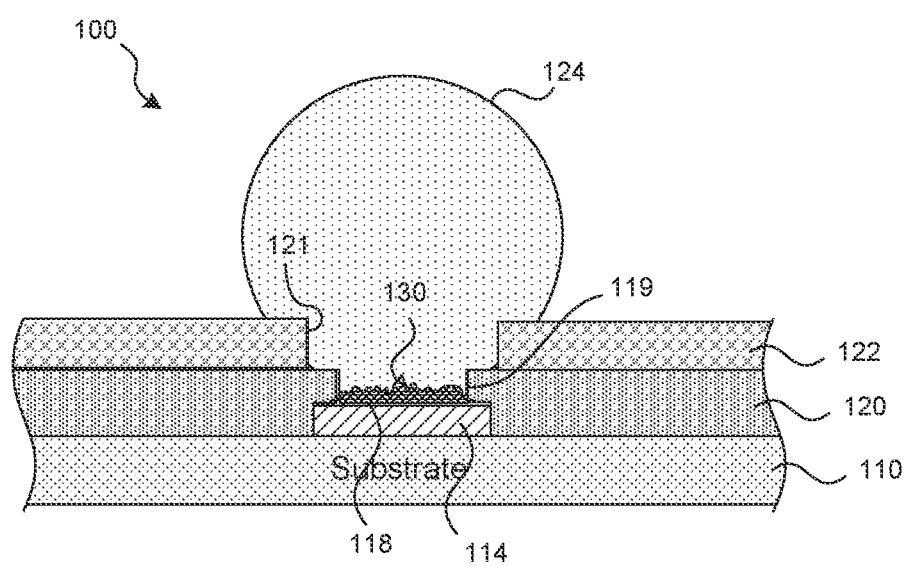
FIG. 2B is a cross-sectional view of the BGA package of FIG. 2A.

FIG. 2A illustrates a top view of a portion of a BGA package 100. Again, for clarity, only a single solder ball mounting pad design is shown. However, those skilled in the art understand that the BGA package can include a plurality of a plurality of mounting pads that can respectively receive a plurality of solder balls. The BGA package 100 can include a substrate 110 having a solder-mask-defined mounting pad 128 formed thereon. The SMD mounting pad 128 is formed using a two-step SMD process in which a first SMD area formed in the solder resist layer 120 (see FIG. 2B) and a second SMD area is formed in the buffer layer 122. FIG. 2B is a cross-sectional view of the BGA package 100, including the substrate 110 and terminal pad 114 along the lines 2B-2B in FIG. 2A. The substrate 110 may comprise an insulative material, such as bismaleimide triazine, flexible polyimide film or tape, fiberglass, polyimide tape, ceramic, or silicon, or, alternatively, it may comprise a semiconductor chip or die. Typically, a layer of metal, e.g., copper, aluminum, gold, silver, nickel, tin, platinum, or a combination of the foregoing can be laminated and/or plated on a surface of the substrate 110. The layer of metal can then be patterned using known photolithography techniques into a terminal pad 114, which may include one or more circuit traces 116 (shown by dotted lines) extending from it. In addition to the circuit traces 116, a plated through-hole, called a "via" (not shown), may connect the terminal pad 114 with the opposite surface of the substrate 110 as known in the art.

An insulative layer in the form of solder resist layer 120 is formed over the metal layer, including the terminal pad 114. One or more additional insulative layers, for example, in the form of a buffer layer 122, is formed over the solder resist layer 120. The buffer layer 122 helps in mitigating crack initiation in the IMC layer 130 by driving potential crack initiation locations away from an external surface of the solder ball 124. Thus, if a crack develops, the crack grows inward and for a longer period of time before a failure occurs. Once formed, the BGA package 100 can be joined to a carrier substrate (e.g., a PCB board) similar to that shown in FIG. 1 to create an electronic device assembly (not shown).

Turning to FIG. 2B, the solder resist layer 120 can comprise an acrylic or a polyimide plastic or an epoxy resin that is silk screened or spin-coated on the substrate sheet 112. The composition of the solder resist layer 120 is not limited to the materials discussed above and other materials (e.g., photo-definable photosensitive polymers) that can act as a barrier for the solder without adversely affecting the operation of the electronic device assembly can be used. In some embodiments, a dry film solder mask can be employed. The composition of the buffer layer 122 can consist of a non-metallic organic material. For example, in some embodiments, similar to the solder resist layer 120, the buffer layer 122 can comprise an acrylic or a polyimide plastic or an epoxy resin that is silk screened or spin-coated onto the solder resist layer 120. In some embodiments, the application of the buffer layer 122 after the application of the solder resist layer 120 can be a continuous process. For example, when the buffer layer 122 and the solder resist layer 120 are composed of the same material, the application of the layers 120, 122 can be done at the same time (e.g., one thick layer). The composition of the buffer layer 122 is not limited to those discussed above and other organic materials (e.g., photo-definable photosensitive polymers) can be used. In some embodiments, the BGA package 100 can include more than one buffer layer.

An opening or aperture 119 is formed in the solder resist layer 120 and an opening or aperture 121 is formed in the buffer layer 122. In exemplary embodiments of the present technology, the apertures 119 and 121 are aligned to expose at least a portion of the terminal pad 114 to form the SMD mounting pad 128. The solder ball 124 is attached to or formed on the mounting pad 128 via the apertures 119 and 121. The solder resist layer 120 and the buffer layer 122 prevent the solder of the solder ball 124 from attaching to any portion of the terminal pad 114 other than the SMD mounting pad 128.

In some embodiments, one or both apertures 119 and 121 are circular in shape and, in some embodiments, can be aligned to form concentric circles. In some embodiments, one or both apertures 119 and 121 can have a shape that is not circular. The sidewalls of both apertures 119, 121 can be straight or both sloped or one straight and one sloped. For example, the sidewall of the buffer aperture 121 can have an outward slope (e.g., larger opening away from the solder resist layer 120) while the sidewall of the aperture 119 is straight or vice-versa. Of course, any combination of straight sidewalls and sloped sidewalls can be used. In some embodiments, a diameter of aperture 121 is larger than a diameter of the aperture 119. In some embodiments, a diameter of aperture 121 at the interface between the buffer layer 122 and the solder resist layer 120 (also referred to herein as "interface diameter") is larger than an interface diameter of the aperture 119. For example, the interface diameter of the aperture 121 can be larger than the interface diameter of the aperture 119 by 0.5% or more. In some embodiments, the interface diameter of the aperture 121 can be larger than the interface diameter of the aperture 119 by a value in a range of 0.5% to 5%. The interface diameters of the apertures 119 and 121 can be dependent on the configuration and/or application of the electronic device assembly. In some embodiments, one or both apertures 119 and 121 can have an interface diameter that is in a range of 0.2 mm to 0.4 mm.

In some embodiments, a two-step aperture etching process can be used to create the apertures 119 and 121. In some embodiments, the aperture 119 can be formed by etching both the buffer layer 122 and the solder resist layer 120. After the aperture 119 is formed, the aperture 121 (which can have a larger diameter) can be formed by etching just the buffer layer 122. In other embodiments, the aperture 121 in the buffer layer 122 is formed first by etching only the buffer layer 122 and then the aperture 119 (which can have a smaller diameter) can be formed by etching the solder resist layer 120. The etching can be done by photolithography and/or a laser-drill process and/or another process. The etching process can be carefully controlled to ensure that over-etching and/or under-etching of the layers 120,122 is eliminated or kept to an acceptable amount. For example, over-etching and/or under-etching can be controlled by the timing of the laser-drill process and/or the photolithography process during the etch process. In some cases, selective masking of appropriate regions with protective layer(s) can be performed on a step-by-step basis to ensure there is no over-etching and/or under-etching of the layers 120,122 (or at least the over-etching and/or under-etching is kept to an acceptable amount). Because those skilled in the art would understand how to perform an etching process, for brevity, a detailed description of the etching process is omitted.

In some embodiments, the inner and outer solder resist layer 120 and the buffer layer 122 can have a same thickness. In other embodiments, the layers 120 and 122 can have different thicknesses. The thickness of the solder resist layer 120 and/or the buffer layer 122 can be greater than 5 microns. In some embodiments, the thickness of each layer 120, 122 can be in a range of 5 microns to 50 microns, and the combined thickness of the layers 120, 122 can be in a range of 10 microns to 100 microns. In some embodiments, the thickness of the solder resist layer 120 is greater than a thickness of the IMC layer 130. As discussed above, the IMC layer 130 can be formed when the solder ball 124 is formed on top the SMD mounting pad 128. In embodiment where the solder resist layer 120 is thicker than the IMC layer 130, the buffer layer 122 only contacts the solder joint matrix of solder ball 124 and not the IMC mixture, which can help mitigate crack formation. An IMC layer is not formed between the buffer layer 122 and the solder ball 124 because the buffer layer 122 is not metallic.

Figure 3:
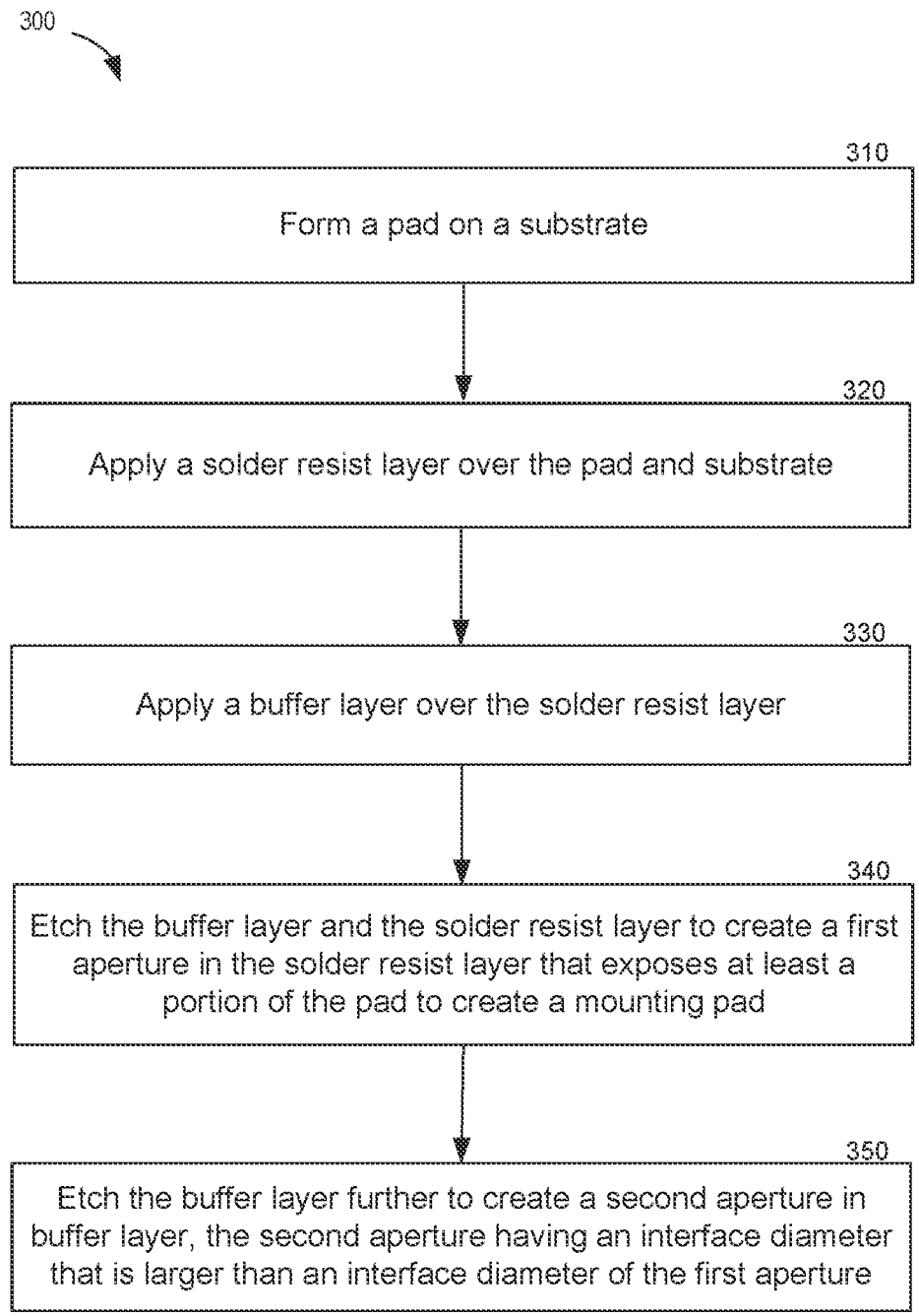
FIG. 3 is flow diagram showing a method of forming a BGA package in accordance with an embodiment of the present technology.

FIG. 3 is a flow diagram illustrating example method 300 for forming a BGA package in accordance with an embodiment of the present technology. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 310, the method 300 includes forming a pad on a substrate. For example, a pad 114 (e.g., a copper pad) can be formed on a substrate 110. At block 320, the method 300 further includes applying a solder resist layer over the pad and substrate. For example, the solder resist layer 120 can be applied over the pad 114 and the substrate 110. At block 330, the method 300 also includes applying a buffer layer over the solder resist layer. For example, the buffer layer 122 can be applied over the solder resist layer 120. At block 340, the method 300 includes etching the buffer layer and the solder resist layer to create a first aperture in the solder resist layer that exposes at least a portion of the pad to create a mounting pad. For example, aperture 119 can be created by photolithography and/or laser-drill process and/or another process that forms an opening in the buffer layer 122 and the solder resist layer 120 to expose at least a portion of the pad 114. Appropriate timing and/or masking and/or other stop etch processes can be used to ensure over-etching and/or under-etchings in the layers 120,122 is eliminated or kept to an acceptable amount. The exposed portion of the pad 114 corresponds to SMD mounting pad 128. At block 350, the method further includes etching the buffer layer further to create a second aperture in buffer layer, the second aperture having an interface diameter that is larger than an interface diameter of the first aperture. For example, aperture 121 can be created by photolithography and/or laser-drill process and/or another process. Again, appropriate timing and/or masking and/or other stop etch processes can be used to ensure over-etching and/or under-etching in the layers 120, 122 is eliminated or kept to an acceptable amount.

In some embodiments, the steps of applying a solder resist layer and a buffer layer (steps 320 and 330) can be a single continuous process. For example, if the solder resist layer 120 and the buffer layer 122 are composed of the same material, a single layer having the thickness of the solder resist layer and the buffer layer can be formed. In some embodiments, in step 340, the aperture in the buffer layer can be formed first and then, in step 350, the aperture in the solder resist layer can be formed next. Of course, appropriate timing and/or masking and/or other stop etch processes can be used to ensure over-etching and/or under-etching in the layers 120,122 is eliminated or kept to an acceptable amount. In some embodiments, the method can include creating additional buffer layers.

By using a two-step SMD design process in which at least one buffer layer is applied over a solder resist layer, a robust electronic device assembly can be formed for high thermal stress applications. Because crack formation in the solder joint can be mitigated, exemplary embodiments of the electronic package assemblies can have high yields and low initial failure rates. In addition, those skilled in the art will recognize that the inventive two-step SMD process is economical and easy to implement as it only adds one additional step to the manufacturing of the BGA package.

It should be noted that the methods described above describe possible implementations, and that the operations and the steps may be rearranged or otherwise modified and that other implementations are possible. Furthermore, embodiments from two or more of the methods may be combined.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
a solder masked defined (SMD) mounting pad, the SMD mounting pad having a first SMD area comprising a first aperture in a solder resist layer and a second SMD area comprising a second aperture in a buffer layer, the buffer layer being disposed on top of the solder resist layer, the first aperture exposing at least a portion of an underlying pad and the second aperture having an interface diameter that is larger than an interface diameter of the first aperture by a value in a range of 0.5% to 5%, wherein a thickness of the solder resist layer is in a range of 5 microns to 50 microns and a thickness of the buffer layer is in a range of 5 microns to 50 microns; and
a solder ball disposed on the SMD mounting pad such that the solder ball contacts a sidewall of the buffer layer exposed by the second aperture and contacts a sidewall of the solder resist layer exposed by the first aperture and has a diameter that is larger than the interface diameter of the second aperture, wherein the sidewall of the solder resist layer or the sidewall of the buffer layer, or both, comprises a taper forming a slope.

2. The apparatus of claim 1, wherein the solder resist layer is thicker than a thickness of an intermetallic compound layer comprising a combination of a first material associated with an interface of the SMD mounting pad and a second material associated with the solder ball, and positioned at the interface of the SMD mounting pad and the solder ball.

3. The apparatus of claim 1, wherein the buffer layer comprises a non-metallic organic material.

4. The apparatus of claim 3, wherein the non-metallic organic material includes at least one of an acrylic, a polyimide plastic, or an epoxy resin.

5. The apparatus of claim 1, wherein the underlying pad is a metal layer composed of at least one of copper, aluminum, gold, silver, nickel, tin, or platinum that is formed on a surface of an insulating substrate.

6. The apparatus of claim 5, further comprising:
a carrier substrate joined to the solder ball and the SMD mounting pad.

7. A method comprising:
forming a solder masked defined (SMD) mounting pad having a first SMD area comprising a first aperture formed in a solder resist layer and a second SMD area comprising a second aperture formed in a buffer layer disposed on top of the solder resist layer, the first aperture exposing at least a portion of an underlying pad and the second aperture having an interface diameter that is larger than an interface diameter of the first aperture by a value in a range of 0.5% to 5%, wherein a thickness of the solder resist layer is in a range of 5 microns to 50 microns and a thickness of the buffer layer is in a range of 5 microns to 50 microns; and
forming a solder ball on the SMD mounting pad such that the solder ball contacts a sidewall of the buffer layer exposed by the second aperture and contacts a sidewall of the solder resist layer exposed by the first aperture and has a diameter that is larger than the interface diameter of the second aperture, wherein the sidewall of the solder resist layer or the sidewall of the buffer layer, or both, comprises a taper forming a slope.

8. The method of claim 7, wherein the solder resist layer is thicker than a thickness of an intermetallic compound layer comprising a combination of a first material associated with an interface of the SMD mounting pad and a second material associated with the solder ball, and formed at the interface of the SMD mounting pad and the solder ball.

9. The method of claim 7, wherein the buffer layer comprises a non-metallic organic material.

10. The method of claim 9, wherein the non-metallic organic material includes at least one of an acrylic, a polyimide plastic, or an epoxy resin.

11. The method of claim 7, wherein the underlying pad is a metal layer composed of at least one of copper, aluminum, gold, silver, nickel, tin, or platinum that is formed on a surface of an insulating substrate.

12. The method of claim 11, further comprising:
joining a carrier substrate to the solder ball and the SMD mounting pad.

* * * * *